US011244803B2

(12) United States Patent
Akinaga (10) Patent No.: US 11,244,803 B2
(45) Date of Patent: Feb. 8, 2022

(54) PLASMA PROCESSING APPARATUS AND OPERATING METHOD OF PLASMA PROCESSING APPARATUS (71) Applicant: Hitachi High-Tech Corporation, Tokyo (JP)

(72) Inventor: Keisuke Akinaga, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 0 days.

(21) Appl. No.: 16/980,966

(22) PCT Filed: Jan. 23, 2020

(86) PCT No.: PCT/JP2020/002267
§ 371 (c)(1),
(2) Date: Sep. 15, 2020

(87) PCT Pub. No.: WO2021/149212
PCT Pub. Date: Jul. 29, 2021

(65) Prior Publication Data
US 2021/0296082 A1 Sep. 23, 2021

(51) Int. Cl.
*H01J 37/18* (2006.01)
*H01J 37/32* (2006.01)

(52) U.S. Cl.
CPC ........ *H01J 37/18* (2013.01); *H01J 37/32816* (2013.01); *H01J 2237/0437* (2013.01); *H01J 2237/182* (2013.01)

(58) Field of Classification Search
CPC ................ H01J 37/18; H01J 37/32816; H01J 37/32431; H01J 2237/0437;
(Continued)

(56) References Cited

U.S. PATENT DOCUMENTS

2007/0020941 A1    1/2007  Tamura et al.
2011/0265899 A1*  11/2011  Cruse .................. G01L 27/005
                                              137/565.23
2017/0268952 A1*   9/2017  Kikuchi ............. G01L 19/0015

FOREIGN PATENT DOCUMENTS

JP         2002020873 A      1/2002
JP         2002280362 A      9/2002
(Continued)

OTHER PUBLICATIONS

Search Report dated Apr. 14, 2020 in International Application No. PCT/JP2020/002267.
(Continued)

*Primary Examiner* — David E Smith
(74) *Attorney, Agent, or Firm* — Miles & Stockbridge, P.C.

(57) ABSTRACT

To provide a plasma processing apparatus or an operating method of a plasma processing apparatus with improved yield. The plasma processing apparatus includes: a sample stage disposed in the processing chamber in a vacuum container; a plasma forming space in which plasma for processing a wafer is formed above the sample stage and a lower space communicated with the plasma forming space below; an exhaust port disposed at a bottom portion of the lower space; a heater for heating a lower portion of the vacuum container surrounding the lower space; a first vacuum gauge that detects a pressure in the processing chamber during the processing of the wafer; a second vacuum gauge for calibration communicated with an opening disposed in an inner wall of the processing chamber surrounding an outer periphery of the lower space below the first vacuum gauge; and a correction unit that is configured to correct an output of the first vacuum gauge by using outputs of the first and second vacuum gauges when a
(Continued)

pressure in the processing chamber is at a pressure value regarded as 0 and at a plurality of pressure values higher than the pressure value.

10 Claims, 5 Drawing Sheets

(58) Field of Classification Search
CPC ......... H01J 2237/182; H01J 2237/2826; H01J 2237/30433
See application file for complete search history.

(56) References Cited

FOREIGN PATENT DOCUMENTS

| | | | |
|---|---|---|---|
| JP | 2004273682 A | | 9/2004 |
| JP | 2006344738 A | | 12/2006 |
| JP | 2007027496 A | | 2/2007 |
| JP | 2010251464 A | * | 11/2010 |
| JP | 2010251464 A | | 11/2010 |
| JP | 2016050357 A | | 4/2016 |
| JP | 2017167102 A | | 9/2017 |

OTHER PUBLICATIONS

Written Opinion dated Apr. 14, 2020 in International Application No. PCT/JP2020/002267.
Office Action dated Oct. 28, 2021 in Korean Application No. 10-2020-7024580.

* cited by examiner

PLASMA PROCESSING APPARATUS AND OPERATING METHOD OF PLASMA PROCESSING APPARATUS

TECHNICAL FIELD

The present invention relates to a plasma processing apparatus for processing a substrate-shaped sample such as a semiconductor wafer disposed in a processing chamber by using plasma formed in the processing chamber in a vacuum container, and an operating method of a plasma processing apparatus, in particular, to a plasma processing apparatus that processes the sample while adjusting a pressure in the processing chamber by using an output of a pressure gauge that detects the pressure inside the processing chamber, and an operating method of a plasma processing apparatus.

BACKGROUND ART

In the plasma processing apparatus as described above, it is known that the output of the pressure gauge in related art used for adjusting the pressure in the processing chamber changes based on an initial state as an operating time of the apparatus elapses or the number of rare processed samples increases. Therefore, when a predetermined operating time or the number of processed samples is reached, the pressure gauge used to regulate the pressure when the sample is processed is calibrated by comparing that output with the output of another pressure gauge for reference whose accuracy is known.

As an example of such a technique in the related art, a technique described in JP-A-2004-273682 (PTL 1) has been known. This related art discloses a technique in which in addition to a control pressure gauge connected to a processing chamber, a calibration pressure gauge connected to a space that is connected to the processing chamber eliminates a need to calibrate the control pressure gauge under an atmospheric pressure. Further, as another example, JP-A-2010-251464 (PTL 2) discloses a technique in which a calibration pressure gauge and a control pressure gauge for controlling a pressure during a film forming process are set at the same mounting point, and the calibration pressure gauge and the control pressure gauge have the same pressure detection condition, so that zero-point calibration of the control pressure gauge is possible in a state close to conditions of an actual film forming process, and the pressure condition in the process can be implemented with high accuracy.

CITATION LIST

Patent Literature

PTL 1: JP-A-2004-273682
PTL 2: JP-A-2010-251464

SUMMARY OF INVENTION

Technical Problem

The technique in the related art described above has a problem since the following points are not sufficiently taken into consideration.

That is, the above-described PTL 1 is in a state in which the connected processing chamber and a load lock chamber are communicated with each other to form a space, PTL 2 has a configuration in which both the calibration pressure gauge and a pressure gauge for adjusting the pressure inside the processing chamber are connected to the processing chamber. Then, this is a technique in which in each case, after an inside of the processing chamber is exhausted to reduce the pressure to a predetermined vacuum degree, the processing chamber is adjusted to a plurality of different pressure conditions, and a correction is added to an output of the pressure gauge for pressure adjustment by using a result obtained by comparing an output of the calibration pressure gauge with the pressure gauge for pressure adjustment of the processing chamber in each pressure state.

However, in the related art, it is not considered that after exhausting and depressurizing the load lock chamber and the processing chamber in a state where a gate valve between the load lock chamber and the processing chamber is hermetically closed, and the gate valve is opened again to make pressures of both the load lock chamber and the processing chamber the same, the calibration pressure gauge connected to the load lock chamber is compared with the pressure gauge for pressure adjustment connected to the processing chamber, and an output of the pressure gauge for pressure adjustment is corrected under a plurality of pressure conditions including a pressure condition close to 0, which is close to the condition of the process performed in the process chamber, that is, a so-called high vacuum pressure condition. There is a problem that the pressure value of the processing chamber at the high vacuum degree, which is adjusted by using the pressure gauge calibrated under the condition of higher pressure, becomes inaccurate.

Further, also in PTL 2, consideration is not given to a point of correcting the output of the calibration pressure gauge under a condition of the pressure of the high vacuum degree pressure such as when a film to be processed is etched on a semiconductor wafer by using plasma. Therefore, in the above-described related art, a pressure value during actual processing of the wafer for manufacturing the semiconductor device deviates greatly from a desired value, which adversely affects a processing result of the wafer and causes a large variation in a dimension of a processed shape obtained after the processing, and a processing yield is spoiled.

An object of the invention is to provide a plasma processing apparatus or an operating method of the plasma processing apparatus that improves a yield.

Solution to Problem

The object is achieved by a plasma processing apparatus or an operating method of the plasma processing apparatus. The plasma processing apparatus includes: a sample stage that is placed in a processing chamber inside a vacuum container and on which a wafer to be processed is placed; a plasma forming space that is a space above the sample stage of the processing chamber and in which plasma for processing the wafer is formed by using a supplied processing gas; a lower space that is a space of a lower portion of the processing chamber below the sample stage, and is in communication with the plasma forming space via a space in the processing chamber on an outer periphery of the sample stage; an exhaust port that is disposed at a bottom portion of the lower space and is in communication with an exhaust device that exhausts and decompresses an inside of the processing chamber; a heater that is configured to heat a lower portion of the vacuum container surrounding the lower space; a first vacuum gauge that is configured to detect a pressure in the processing chamber during the processing of the wafer; a second vacuum gauge for calibration that is below the first vacuum gauge and in communication with an opening that disposed on an inner wall of the processing chamber that surrounds an outer periphery of the lower space; and a correction unit that is configured to correct an output of the first vacuum gauge by using outputs of the first and second vacuum gauges when a pressure in the processing chamber is at a pressure value regarded as 0 and at a plurality of pressure values higher than the pressure value.

Advantageous Effect

According to the invention, it is possible to provide a plasma processing apparatus or an operating method of a plasma processing apparatus that improves a yield.

DESCRIPTION OF EMBODIMENTS

Hereinafter, an embodiment of the invention will be described with reference to the drawings.

Embodiment

Figure 1:
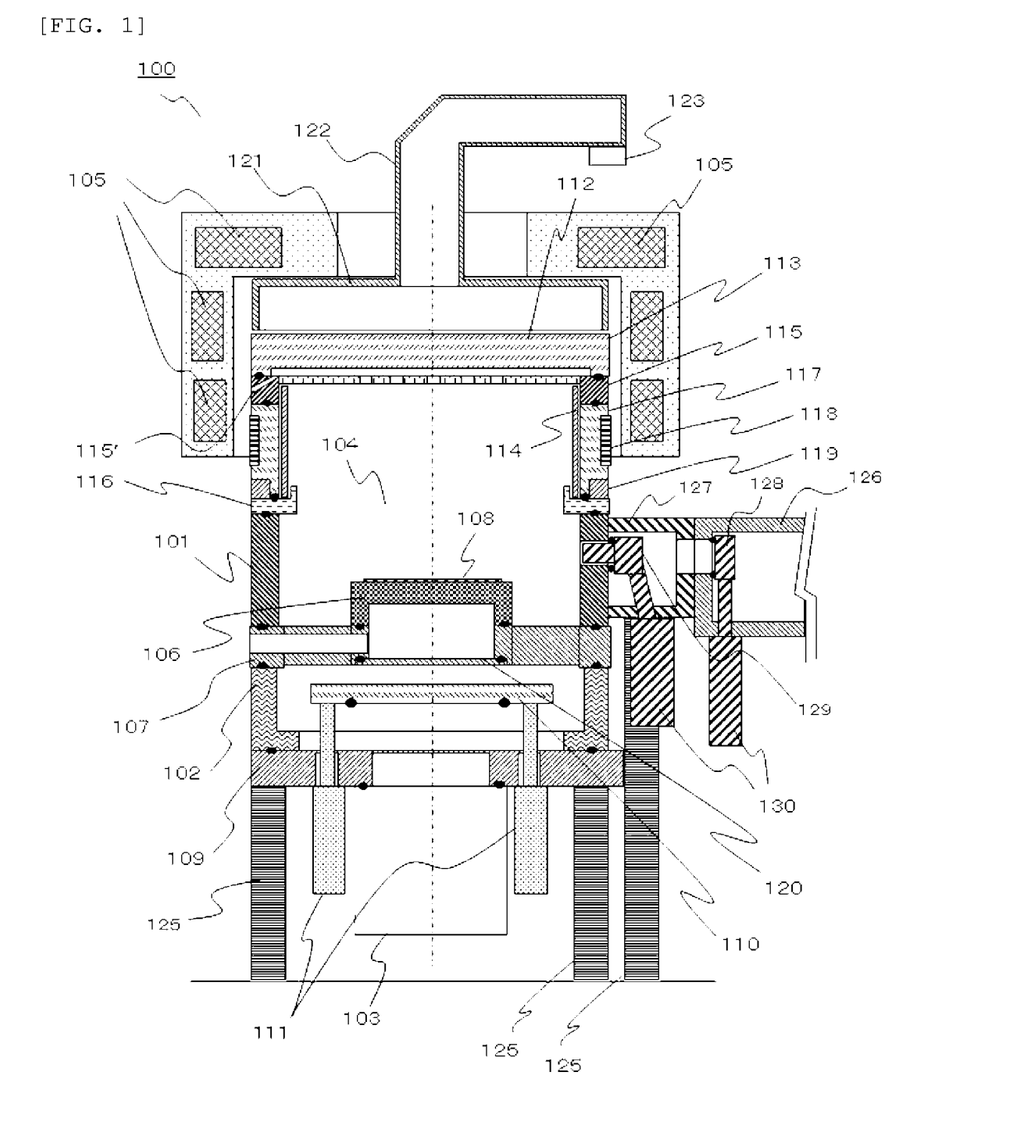
FIG. 1 is a longitudinal sectional view schematically showing an outline of a configuration of a plasma processing apparatus according to an embodiment of the invention.

The embodiment of the invention will be described with reference to FIG. 1 to FIG. 5. FIG. 1 is a longitudinal sectional view schematically showing an outline of a configuration of a vacuum processing chamber according to the embodiment of the invention.

A plasma processing apparatus 100 shown in FIG. 1 has a vacuum container roughly including a base plate 109 having a circular exhaust port 124 in a central portion, an upper container 101 disposed above the base plate 109 and having a cylindrical inner side wall surface, a lower container 102 disposed below the upper container 101, and a sample stage base 107 sandwiched therebetween. Further, below the vacuum container, there is provided an exhaust portion including an exhaust pump 103 such as a turbo molecular pump, which is disposed to be connected to the vacuum container. Further, above the vacuum container, a plasma forming portion including a waveguide 122 and a solenoid coil 105 through which an electric field of a predetermined frequency for forming plasma in a space inside the vacuum container is disposed.

Outer wall surfaces of the upper container 101, the lower container 102, and the sample stage base 107 face an atmosphere around the plasma processing apparatus 100, and inner wall surfaces surrounds a periphery of a processing chamber 104 which is a space where a pressure is reduced by the exhaust pump 103 and plasma is formed. The inner wall surfaces of these members have a cylindrical shape with a horizontal cross section having a circular shape, and in order to minimize a step at a seam of the inner side wall surface at a position where a center of the cylindrical shape of the processing chamber 104 surrounded by each member matches or is approximated in a vertical direction, these members are pressed in the vertical direction with a seal member such as an O-ring interposed therebetween, positioned and connected to each other. In such a connected state, these members form a vacuum partition, and the atmospheres of the inside and the outside of the processing chamber 104 are hermetically partitioned.

An upper space of the processing chamber 104 is a space where the plasma is formed as a discharge portion, and a sample stage 106 on which a wafer 108 to be processed is placed is disposed below the space. The processing chamber 104 of the present embodiment has a space below a bottom surface of the sample stage 106 and between a bottom surface of the processing chamber 104 and the bottom surface of the sample stage 106, and on the bottom surface of the processing chamber 104 below the bottom surface of the sample stage 106, a circular opening of the exhaust port 124 that discharges gas and particles such as the plasma in the processing chamber 104 is disposed.

Above the upper container 101, a grounding ring 116 made of a conductive material having a ring shape, a ring-shaped discharge block base 119 placed on an upper surface of the grounding ring 116, and a discharge portion container 117 which is placed on the discharge block base 119 and has a cylindrical shape surrounding an outer periphery of the discharge portion, are disposed. A cylindrical inner side wall portion of the discharge portion container 117 is disposed so as to cover a side wall on an inner peripheral side of the discharge block base 119, and a quartz inner cylinder disposed so as to cover an inner side wall surface of the discharge portion container 117 is disposed inside the discharge portion container 117 and between the discharge portion container 117 and the discharge portion which is a space in which the plasma is formed, so that interaction between the plasma and the inner side wall of the discharge portion container 117 is prevented to reduce damage and wear.

A heater 118 is wound on an outer peripheral side of an outer wall surface of the discharge portion container 117 and is disposed in contact with the wall surface. The heater 118 is electrically connected to a DC power source (not shown), and is supplied with current from the DC power source to generate heat, and a temperature of the inner side wall surface of the discharge portion container 117 is adjusted to a value within a desired range.

The grounding ring 116, which is a ring-shaped member made of the conductive material, is disposed between lower end faces of the discharge portion container 117 and the discharge block base 119 and an upper end face of the upper container 101 disposed below the discharge block base 119. An upper surface of the grounding ring 116 is connected to a lower end surface of the cylindrical portion of the discharge portion container 117, a lower surface of the grounding ring 116 is connected to an upper end surface of the upper member 101 with the O-ring interposed therebetween, and a force for pressing them in the vertical direction is supplied, so that the inside and outside of the processing chamber 104 are hermetically sealed. Although not shown, the grounding ring 116 is electrically connected to a ground electrode, and an inner peripheral side end portion protrudes from the periphery to a center side in the discharge portion inside the processing chamber 104 and comes into contact with the plasma, so that a plasma potential is adjusted to be within a desired range of an owner. Further, an inner cylinder 114 is disposed above an upper surface of the inner peripheral side end portion of the grounding ring 116, with a gap between the inner cylinder 114 and the inner side wall surface of the discharge portion container 117.

Further, above an upper end of the discharge portion 117, a gas ring 115, which is a ring-shaped member in which a path of a processing gas supplied to form the plasma in the processing chamber 104, is disposed with an O-ring interposed therebetween. Above the upper surface of the gas ring 115, a window member 112 having a disc shape, which is a member made of a dielectric material such as quartz, which constitutes the vacuum container and transmits an electric field supplied to the discharge portion, is placed and sandwiches the O-ring, and an outer peripheral edge lower surface of the window member 112 and an upper surface of the gas ring 115 are connected to each other.

A shower plate 113, which is a disc-shaped member made of the dielectric material such as quartz, is disposed below a lower surface of the window member 112 with a gap therebetween, and covers an upper portion of the discharge portion of the processing chamber 104 to form a top surface thereof. A plurality of through holes are disposed in a circular region at a central portion of the shower plate 113. An inside of the gas ring 115 includes a processing gas supply path connected, via a pipe, to a gas source that includes a plurality of tanks (not shown) with a flow rate controller (mass flow controller, MFC) sandwiched therebetween, and a gas flow path 115' communicated with a gap between the window member 112 and the shower plate 113. A gas from each type of the gas source whose flow rate or speed is regulated by the flow rate controller is supplied along the pipe and merged into one gas supply path, then flows into the gap between the window member 112 and the shower plate 113 through the gas flow path 115' in the gas ring 115 and diffuses in the gap, and is introduced into the processing chamber 104 from above through the plurality of through holes in the central portion of the shower plate 113.

The window member 112, the shower plate 113, the gas ring 115, the discharge portion container 117, and the discharge block base 119 are connected with the O-ring interposed therebetween to form the vacuum container, and also form a discharge block together with the inner cylinder 114. As will be described later, the discharge block moves in the vertical direction along a vertical axis of a lifter (not shown), so that the vacuum container can be disassembled or assembled. The discharge block may include the grounding ring 116, or may be disassembled by vertically dividing the vacuum container between the upper container 101 and the grounding ring 116.

The waveguide 122 for propagating an electric field of a microwave supplied to form plasma in the discharge portion of the processing chamber 104 is disposed above the window member 112. The waveguide 122 includes a cylindrical circular waveguide portion extending along the vertical axis and having a circular horizontal cross section perpendicular to the vertical axis, and a square waveguide portion extending along a horizontal axis, having a rectangular or square cross section in the vertical direction perpendicular to the horizontal axis, and one end portion of which is connected to an upper end portion of the circular waveguide portion, and a magnetron 123 that oscillates to form an electric field is disposed at a portion on the other end side of the square waveguide portion. The electric field of the formed microwave propagates horizontally in the square waveguide portion, changes a direction thereof at the upper end portion of the circular waveguide portion, and propagates toward the processing chamber 104 below the lower window member 112.

A lower end portion of the circular waveguide portion is connected to a circular central portion of a ceiling portion of a cylindrical cavity portion 121 which is below the lower end portion, above the window member 112, and has an inner diameter that is the same as or close to that of the window member 112. An inside of the circular waveguide portion and a cavity inside the cavity portion 121 are communicated with each other through a circular opening whose inner diameter is equal to that of the circular waveguide in a center of the circular ceiling portion, and the cavity portion 121 constitutes a part of the waveguide 122. The electric field of the microwave propagating in the circular waveguide is introduced into the cavity portion 121, then a desired electric field mode is formed inside the cavity portion 121, and the electric field passes through the window member 112 and the shower plate 113 below and propagates into the processing chamber 104.

Further, in the present embodiment, by surrounding an outer peripheral side of the circular waveguide portion of the waveguide 122 above the cavity portion 121 and outer peripheral sides of the cavity portion 121 and a cylindrical outer side wall of the discharge portion container 117, a plurality of stages of ring-shaped solenoid coils 105 are disposed together with a yoke in the vertical direction. These solenoid coils 105 are electrically connected to a DC power supply (not shown) and supplied with a DC current to generate a magnetic field. The electric field of the microwave supplied from the waveguide 122 and the magnetic field generated and supplied from the solenoid coil 105 interact with each other inside the processing chamber 104 to cause electron cyclotron resonance (ECR), atoms or molecules of the processing gas supplied into the processing chamber 104 are excited, and the excited atoms or molecules are ionized or dissociated to form plasma in the discharge portion of the wafer 108 during processing.

The sample stage 106 is disposed at a central portion of an inner side of the ring-shaped sample stage base 107, and is connected to the sample stage base 107 by a plurality of support beams connected therebetween. The support beams of the present embodiment are disposed radially in a so-called axial symmetry at the same angle in a peripheral direction as when viewed from above a central axis of the sample stage 106 having a cylindrical shape in the vertical direction which is indicated by an one-dot chain line in the drawing, or at angles approximate to this angle. With such a configuration, particles such as the plasma formed in the discharge portion inside the upper container 101, the supplied gas, and reaction products generated during the processing of the wafer 108 pass through a space between the sample stage 106 and the upper container 101, a space between the sample stage 106 and the sample stage base 107, that is, a space between the support beams through a space inside the lower container 102 by an operation of the exhaust pump 103, and are discharged through the exhaust port 124 directly below the sample stage 106, and a flow of particles in the processing chamber 104 above the upper surface of the wafer 108 is reduced in variation in a peripheral direction of the wafer 108, and uniformity of the processing of the wafer 108 is improved.

The sample stage 106 has an internal space, and a bottom thereof sample stage is attached to a sample stage bottom cover 120 so as to hermetically seal an inside and an outside, thereby sealing the space. Further, a path communicating with the atmosphere of the atmospheric pressure outside the sample stage base 107 is disposed inside the plurality of support beams, so that the space inside the sample base 106 communicates with the outside. These spaces and paths are regions for disposing supply paths such as cables and pipes that are disposed outside the sample stage base 107 and supply fluid such as electric power, refrigerant, and gas to the sample stage. The path and the space inside the sample stage 106 are set to an atmospheric pressure the same as the atmosphere or a pressure approximate to the atmospheric pressure.

Further, each of the upper container 101 and the lower container 102 has a flange portion (not shown) on an outer side wall thereof. The lower container 102 and the upper container 101 above the lower container 102 are positioned with respect to the base plate 109 by fastening each flange portion with a screw or a bolt. The outer peripheral side walls of the upper container 101, the lower container 102, and the sample stage base 107 of the present embodiment have a cylindrical shape, but they may have a rectangular horizontal cross-sectional shape or another shape instead of a circular shape.

The base plate 109 is connected to upper end portions of a plurality of columns 125 on a floor of a building such as a clean room where the plasma processing apparatus 100 is installed, and is placed and supported on these columns 125. That is, the vacuum container including the base plate 109 is positioned on a floor surface of the building through the plurality of columns 125.

Further, the exhaust pump 103 is disposed in a space between the columns 125 below the base plate 109, and communicates with the processing chamber 104 via the exhaust port 124. The exhaust port 124 is disposed direct below the sample stage 106 at a position where the vertical axis passing through the center of the circular opening matches the central axis or is approximate to the degree of being regarded as matching, and a substantially disc-shaped exhaust port cover 110 that is closed or moves vertically with respect to the exhaust port 124 is disposed inside the processing chamber 104 above the exhaust port 124. The exhaust port cover 110 moves vertically in accordance with an operation of an exhaust gas adjuster 111 having a driving device such as an actuator disposed below the base plate 109, such that a function of a flow rate adjustment valve that increases or decreases conductance of exhaust of the particles in the processing chamber 104 from the exhaust port 124 is implemented by increasing or decreasing an area of a flow path of the particles in the processing chamber 104 discharged from the exhaust port 124, and an amount and a speed of the internal particles discharged by the exhaust pump 103 are adjusted by driving the exhaust port cover 110 based on a command signal from a control unit (not shown).

The vacuum container of the plasma processing apparatus 100 is another vacuum container horizontally adjacent to the plasma processing apparatus 100, holds the wafer 108 on an upper surface of a tip end portion of an arm in a transfer chamber whose inside is a decompressed space, and is connected to a vacuum transfer container 126 in which a transfer robot that transfers the inside of the transfer chamber is disposed. The inside of the processing chamber 104 and the vacuum transfer chamber are connected between the plasma processing apparatus 100 and the vacuum transfer container via a gate that is a path through which the wafer 108 passes. Further, in the vacuum transfer chamber, there is provided a gate valve 128 that opens an opening of the gate disposed on an inner side wall surface by being moved vertically and horizontally with respect to the inner side wall surface of the vacuum transfer container 126 and abuts against the inner side wall surface with the O-ring sandwiched therebetween to hermetically close the opening.

Further, in the present embodiment, a valve box 127 including another gate valve 129 in the internal space is disposed between the upper container 101 and the vacuum transfer container. The valve box 127 has two end portions connected to the outer side wall surface of the upper container 101 and the side wall surface of the vacuum transfer container respectively with a seal member such as an O-ring interposed therebetween, and has a space that is hermetically partitioned from the atmosphere of atmospheric pressure in the valve box. The side wall surface at one end portion of the valve box 127 is connected to a periphery of an opening of a gate on a side wall of a vacuum transfer container 126, and the side wall surface at another end portion is connected to a periphery of an opening of a gate disposed on the side wall of the upper container 101, so that the space inside the valve box 127 constitutes a path through which the wafer 108 is carried by the arm of the transfer robot and transferred.

The gate valve 129 disposed inside the valve box 127 moves vertically and horizontally with respect to the outer side wall of the upper container 101 to open the opening of the gate of the upper container 101 or abut against the outer side wall surface with the O-ring sandwiched therebetween to hermetically seal the opening. Below each of the vacuum transfer container 126 and the valve box 127, a driving machine 130 such as an actuator connected to one of the gate valves 128, 129 disposed inside thereof and moving the gate valves is disposed.

Further, the valve box 127 of the present embodiment is connected to and supported by an upper end portion of another column 125 whose lower end is connected to the floor of the building and positioned by the screw or the bolt, a side wall surface at one end portion of the valve box 127 is positioned and disposed so as to implement airtight sealing by connecting to the outer wall surface of the upper container 101 on an outer peripheral side of the gate with the O-ring interposed therebetween. In addition to the aspect that the valve box 127 of the embodiment in FIG. 1 is supported on the floor surface of the building by the column 125, the valve box 127 of the embodiment shown in FIG. 1 may be supported by another column 125 connected to the column 125 below the base plate 109, or may be positioned on an upper surface of an end portion of the base plate 109 on the vacuum transfer container side by being fastened with the screws or the bolts.

Prior to the processing of the wafer 108, the unprocessed wafer 108 is placed and held on the upper surface of the tip end portion of the arm of the transfer robot, and is carried from the vacuum transfer container through the space inside the valve box 127 to the inside of the processing chamber 104 that is depressurized in advance. When the wafer 108 is transferred from a state in which the wafer 108 is held on the arm above the upper surface of the sample stage 106 inside the processing chamber 104 to a plurality of pins protruding from the upper surface of the sample stage 106, the arm of the vacuum robot exits from the processing chamber 104 into the vacuum transfer chamber. The wafer 108 is placed on the upper surface of the sample stage 106, and the gate valve 129 is driven to hermetically close the gate of the upper container 101.

In this state, the processing gas including a plurality of gases whose flow rate or speed is adjusted by the flow rate controller is introduced into the processing chamber 104 from the gas supply path and the gas flow path 115' through the gap between the window member 112 and the shower plate 113 and the through holes of the shower plate 113, and meanwhile, the gas particles in the processing chamber 104 are exhausted by the operation of the exhaust pump 103 communicating with the exhaust port 124, and the pressure in the processing chamber 104 is adjusted to a value within a range suitable for processing by a balance of these particles. Further, the electric field of the microwave formed by using the magnetron 123 propagates in the waveguide 122 and the cavity portion 121, passes through the window member 112 and the shower plate 113, and is supplied into the processing chamber 104, and meanwhile the magnetic field formed by the solenoid coil 105 is supplied into the processing chamber 104, and plasma is formed in the discharge portion by using the processing gas.

In a state where the wafer 108 placed and held on an upper surface, a radio frequency power of a predetermined frequency is supplied to an electrode (not shown) disposed inside the sample stage 106, a bias potential having a difference from the plasma is formed above the upper surface of the wafer 108, due to the potential difference, charged particles such as ions in plasma are attracted to the upper surface of the wafer 108, and an etching process progresses by colliding with a film layer to be processed having a film structure having a film layer to be processed disposed on the upper surface of the wafer 108 in advance and a mask layer made of a material such as a resist stacked above the film layer.

When it is detected by a detector (not shown) that the etching process of the film layer to be processed reaches a predetermined remaining film thickness or depth, the supply of the radio frequency power to the electrodes inside the sample stage 106 and formation of the plasma are stopped and the etching process ends. Next, after the particles inside the processing chamber 104 are sufficiently exhausted, the gate valve 129 is driven to open the gate of the upper container 101, the arm of the transfer robot enters the processing chamber 104 through the gate, the wafer 108 is transferred onto the arm from the sample stage 106, and the arm exits out of the processing chamber 104, so that the processed wafer 108 is carried to the vacuum transfer chamber.

The control unit determines whether there is an unprocessed wafer 108 to be processed next, and when the next wafer 108 exists, after the wafer 108 is carried into the processing chamber 104 through the gate again and transferred to the sample stage 106, the etching process is performed on the wafer 108 in a similar manner as described above. When it is determined that there is no wafer 108 to be processed next, an operation of the plasma processing apparatus 100 that processes the wafer 108 for manufacturing a semiconductor device is stopped or ended.

Figure 2A:
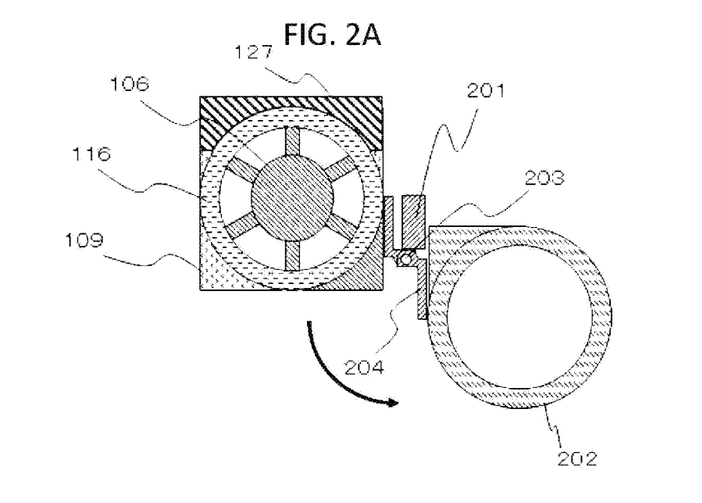
FIGS. 2A and 2B are diagrams schematically showing maintenance operation on the plasma processing apparatus according to the embodiment shown in FIG. 1 and a state of the plasma processing apparatus at that time.
Figure 2B:
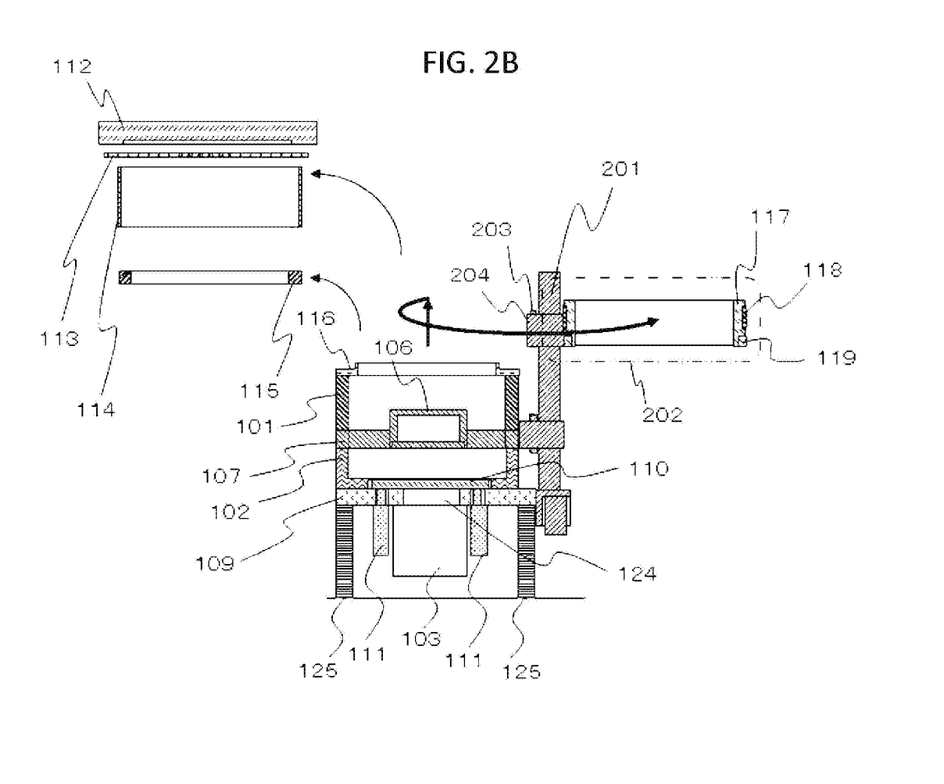
Figure 3A:
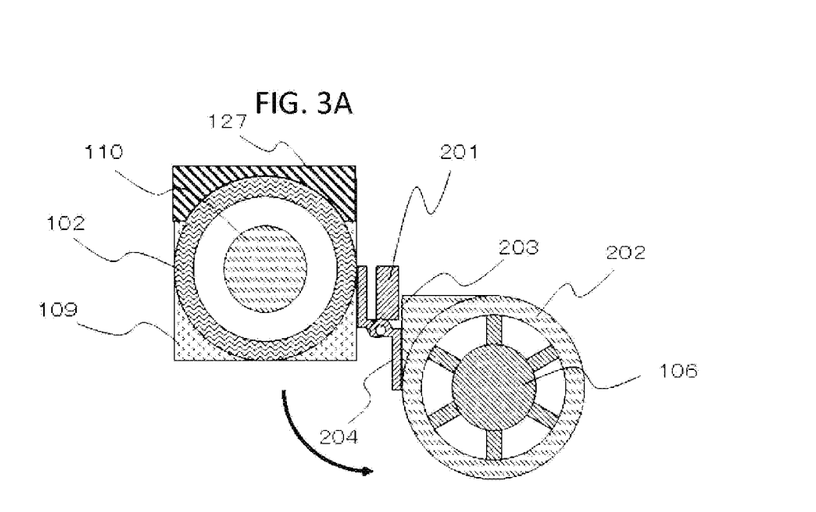
FIGS. 3A and 3B are diagrams schematically showing maintenance operation on the plasma processing apparatus according to the embodiment shown in FIG. 1 and a state of the plasma processing apparatus at that time.
Figure 3B:
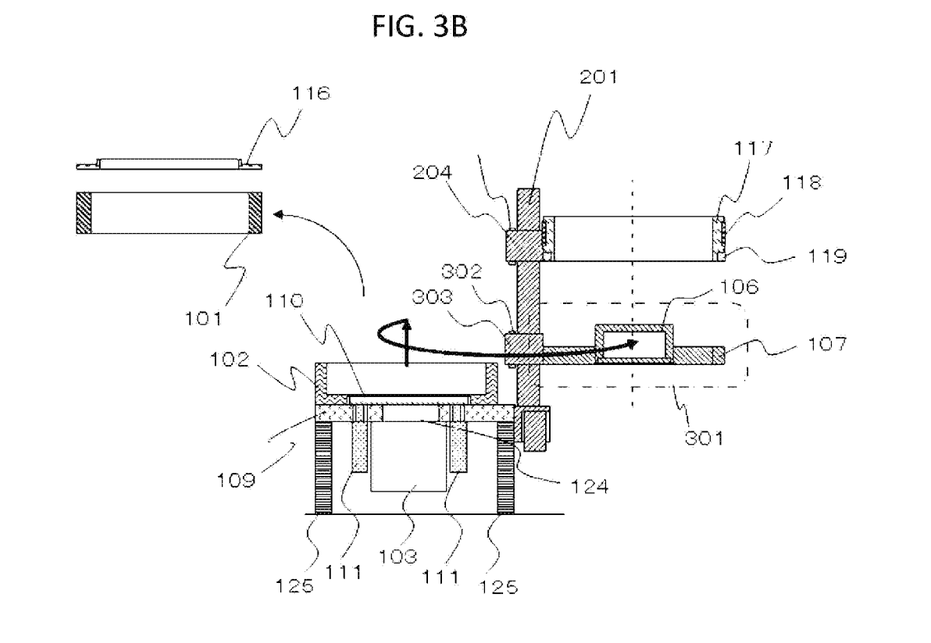

Next, a flow of maintenance operation such as maintenance and inspection of the plasma processing apparatus 100 of the present embodiment will be described with reference to FIGS. 2A and 2B and 3A and 3B. FIGS. 2A and 2B and 3A and 3B are diagrams schematically showing maintenance operations on the plasma processing apparatus according to the embodiment shown in FIG. 1 and a state of the plasma processing apparatus at that time. Further, FIGS. 2A and 3A are a plan view of the vacuum container of the plasma processing apparatus 100 when viewed downward from a vertically upper position in the drawing, and FIGS. 2B and 3B are a vertical sectional view.

In the embodiments shown in these drawings, when the described-above control unit detects that the number of the wafers 108 processed after maintenance is performed on the processing chamber 104 or a cumulative value of a time when the processing is performed in the processing chamber 104 reaches a predetermined value, after the processing of the wafer 108 that reaches the value in the processing chamber 104 is completed and is subsequently carried out of the processing chamber 104, the control unit transmits a command signal from the control unit to each portion of the plasma processing apparatus 100, and an operation (steady operation) of processing the wafer 108 for manufacturing the semiconductor device of the plasma processing apparatus 100 is switched to an operation for maintenance (maintenance operation). In a maintenance operation mode of the plasma processing apparatus 100, the driving machine 130 is operated based on the command signal from the control unit, and the gate valve 128 hermetically closes the gate facing the vacuum transfer chamber in the vacuum transfer container 126, a space on the processing chamber 104 side and a space on the vacuum transfer chamber side are sealed, and the inside of the processing chamber 104 is set to atmospheric pressure so that the upper portion can be opened.

That is, in a state in which the exhaust port cover 110 at the bottom portion of the processing chamber 104 is brought into contact with the upper surface of the base plate 109 around the opening above the exhaust port 124 via a seal member such as an O-ring by driving the exhaust gas adjuster 111, and the exhaust port 124 is hermetically sealed between the lower exhaust path and the processing chamber 104, air or gas is introduced into the processing chamber 104 to increase the pressure inside the processing chamber 104. When the control unit detects and notifies that the pressure in the processing chamber 104 is increased to a value that is the same as or close to a level that can be regarded as the atmosphere, an operator can move the upper portion of the vacuum container upward to disassemble the vacuum container and open the processing chamber 104 to the atmosphere around the plasma processing apparatus 100.

The operator firstly uses the solenoid coil 105 and the magnetron waveguide 122 whose lower portion is fixed to the base plate 109 and is connected to a lifter 201 having an axis in the vertical direction as a unit, and moves the unit upward along the axis. In this state, the upper surface of the window member 112 constituting the upper portion of the vacuum container is exposed.

In the present embodiment, the operator removes the discharge block forming the upper portion of the vacuum container in this state. Firstly, the window member 112, the shower plate 113, and the quartz inner cylinder 114 are further moved upward and horizontally from a position where the gas introduction ring 115 is attached, and removed. After that, the operator uses the discharge block base 119 connected to the vertical axis of the lifter 201 via a connection arm 204, the discharge block 117 mounted thereon and a heater 118 as a discharge portion container unit 202, and moves the discharge portion container unit 202 upward along the vertical axis of the lifter 201 as shown by an arrow together with the connection arm 204.

One end portion of the connection arm 204 of the present embodiment is fastened and fixed to the discharge block base 119 with a screw or a bolt, another end portion is connected to the vertical axis of the lifter 201 outside a side wall of the pivot lifter 201 so as to be movable along the vertical axis. Further, the connection arm 204 includes a joint portion including a vertically movable shaft 203 disposed in parallel with the vertical shaft of the lifter 201 and in which one end portion of the connection arm 204 is pivotally connected around the movable shaft 203.

The operator pivots the discharge portion container unit 202 located at a position having a sufficient vertical distance from the grounding ring 116 located below or the upper container 101 in a counterclockwise direction around the movable shaft 203 by moving the discharge portion container unit 202 upward, thereby moving the discharge portion container unit 202 to an outside of a region projected above the upper container 101 or the sample stage base 107 when viewed from above. In the present embodiment, the discharge portion container unit 202 is disposed at a right end portion of the base plate 109 in the drawing and at a position far from the central axis of the sample stage 106 when viewed from the valve box 127, and is pivoted counterclockwise around the pivot shaft 203 of the connected lifter 201 when viewed from above, but the lifter 201 may be disposed on an opposite side (a left end portion of the base plate 109 in the drawing), and the discharge portion container unit 202 may be pivoted clockwise and removed when viewed from above.

Further, an angle at which the discharge portion container unit 202 is removed from a position where a vertical central axis of the discharge portion container 117 matches or is considered to be the central axis of the sample stage 106 and is pivoted is 180 degree, but the angle can be 90 degree or more and 270 degrees or less. However, considering workability, 180 degree±20 degree is preferable.

In the present embodiment, since the grounding ring 116 is not connected and fixed to the discharge block base 119 or the discharge portion container 117, after the discharge portion container unit 202 is removed, the ground ring 119 is removed from above an upper end of the upper container 101. In this state, the upper container 101 can be removed by being moved above the sample stage base 107. That is, the upper container 101 can be removed in a swappable (exchangeable) state.

In the present embodiment, in a state in which the grounding ring 116 is removed, the screws or bolts for fastening the upper container 101 placed on the sample stage base 107 to the base plate 109 and fixing the position are removed, and connection therebetween is removed. In this state, as shown in FIGS. 3A and 3B, the upper container 101 and a sample stage unit 301 including the upper container 101, the sample stage base 107 on which the upper container 101 is placed, the sample stage 106, and a plurality of support beams are moved upward together with a connection arm 303 along the vertical axis of the lifter 201, then horizontally pivoted counterclockwise around a movable shaft 302 of the joint portion of the connection arm 303 disposed outside the side wall of the lifter 201, and moved to the outside of the region projected above the lower container 102 when viewed from above in the vertical direction.

That is, similar to the discharge portion container unit 202, one end portion of the connection arm 303 of the present embodiment is fastened and fixed to the sample stage base 107 with a screw or a bolt, another end portion is connected to the vertical axis of the lifter 201 outside a side wall of the pivot lifter 201 so as to be movable along the vertical axis. Further, the connection arm 303 includes the joint portion including a vertically movable shaft 302 disposed in parallel with the vertical shaft of the lifter 201 and in which one end portion of the connection arm 303 is pivotally connected around the movable shaft 302.

As shown by the arrow in the drawing, after the operator moves the sample stage unit 301 on which the upper container 101 is placed upward and positions the sample stage unit 301 at a position having a sufficient vertical distance from the lower container 102 below, by horizontally pivoting counterclockwise around the movable shaft 302, the side wall around the gate opening of the upper container 101 is peeled off from a curved connection surface of the valve box 127, and after being moved around the movable shaft 302 by a predetermined angle from the position in contact with the valve box 127, the sample stage base 107 is once fixed at the position of the angle around the joint portion. In this state, the upper container 101 and the sample stage unit 301 overlap a part of the upper projected region of the lower container 102 when viewed from above.

After the upper container 101 separated from the valve box 127 is moved upward and horizontally and is removed, the sample stage unit 301 is again horizontally pivoted around the movable shaft 302 and moved to the outside of the projected region directly above the lower container 102 when viewed from above. In the present embodiment, the sample stage unit 301 is pivoted counterclockwise around the pivot shaft 302 of the connected lifter 201 when viewed from above, but the lifter 201 may be disposed on the opposite side (the left end portion of the base plate 109 in the drawing), and the sample stage unit 301 may be pivoted and removed clockwise when viewed from above.

Since the sample stage unit 301 is removed from the upper projected region, the lower container 102 can be easily removed from the upper surface of the base plate 109. The upper container 101 and the lower container 102 of the present embodiment are subject to, according to a predetermined procedure after the sample stage unit 301 is removed, maintenance such as cleaning, removal of reaction products, removal of a film coating the surface, and recoating. In place of the removed upper container 101 or lower container 102 that is subject to such maintenance, before the maintenance operation, replacement components such as the upper container 101 which is prepared in advance before use or is subject to the predetermined maintenance are mounted on the base plate 109 in a reverse order of the above-mentioned removal.

On the other hand, after the lower container 102 is removed, the surface of the base plate 109 and the surface of the exhaust port cover 110 are inspected and maintained. Since a large proportion of the upper surface of the base plate 109 is covered with the lower container 102, as compared with the upper container 101 and the lower container 102, an adhesion amount of a reaction product generated by the processing of the wafer 108 in the processing chamber 104 is smaller. For this reason, the lower container 102 is attached to the upper surface of the base plate 109 after the operator washes or cleans the exhaust port cover 110.

Figure 4:
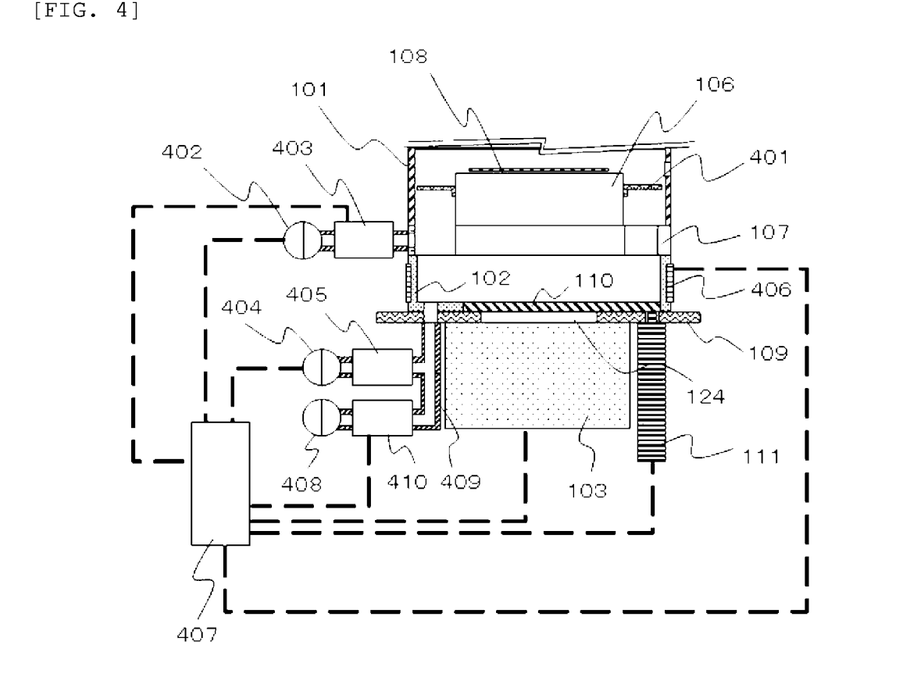
FIG. 4 is a diagram schematically showing maintenance operation on the plasma processing apparatus according to the embodiment shown in FIG. 1 and a state of the plasma processing apparatus at that time.

The vacuum container of the plasma processing apparatus 100 of the present embodiment includes a plurality of vacuum gauges for detecting the pressure inside the processing chamber 104, which is a space disposed inside. Connection between these vacuum gauges and the vacuum container will be described with reference to FIG. 4. FIG. 4 is a diagram schematically showing a maintenance operation on the plasma processing apparatus according to the embodiment shown in FIG. 1 and a state of the plasma processing apparatus at that time.

In this drawing, the upper container 101 that constitutes the vacuum container and main parts of the members below are shown. Members constituting the vacuum container disposed above the upper container 101, the solenoid coil 105 and the waveguide 122 forming the plasma forming portion and members connected to the solenoid coil 105 and the waveguide 122, and the column 125 connected to the base plate 109 below the base plate 109 are omitted. Further, the elements shown in FIGS. 1 to 3B and denoted by the same reference numerals will not be described unless particularly necessary.

In the present embodiment, a confinement ring 401 is disposed on an outer peripheral side of the side wall of the sample stage 106 inside the vacuum container and between the side wall of the sample stage 106 and the inner peripheral side wall of the upper container 101. The confinement ring 401 is made of a cylindrical member disposed to surround the outer peripheral side of the outer peripheral side wall of the sample stage 106 having an inner peripheral edge portion having a cylindrical shape. Further, on an outer peripheral side of an upper end portion of the inner peripheral edge portion of the confinement ring 401, a plate-shaped flange portion extending horizontally (a paper surface direction on the drawing) on an outer side in a radial direction when viewed from above with respect to the vertical center axis of the sample stage 106 is disposed in a ring shape so as to surround the inner peripheral edge portion, and the inner peripheral edge portion and the flange portion are formed as an integral member.

Both the inner peripheral edge portion and the flange portion of the confinement ring 401 are provided with a metal base body and a coating film formed on the surface thereof with a ceramic material such as alumina or yttria. The confinement ring 401 of the present embodiment is electrically connected to the lower container 102 or the base plate 109 via the sample stage 106 or the sample stage base 107, and similar to the base plate 109, is set to the ground potential when the wafer 108 is processed. Further, in a plate-shaped part of the flange portion having a ring-shaped planar shape, a plurality of through holes vertically penetrating the flange portion are disposed to surround the sample stage 106.

That is, the sample stage 106 is surrounded by the flange portion of the confinement ring 401 when viewed from above, and is also surrounded by a ring of the flange portion of the confinement ring 401 between the sample stage 106 and the upper container 101 or a space inside a large number of through holes disposed in an arc-shaped region. The ring on the outer peripheral side of the sample stage 106 in the processing chamber 104 when viewed from above or the spaces disposed in at least one arc-shaped region become a path for particles such as plasma formed in the space between the wafer 108 on the upper surface of the sample stage 106 and the shower plate 113 and the gas supplied into the processing chamber 104 or reaction products formed when the wafer 108 is processed flowing through therebelow and moving to the space inside the processing chamber 104 below the sample stage 106 and above the exhaust port 124. In the present embodiment, plasma is not formed in the space below the sample stage 106 when the wafer 108 is processed.

The confinement ring 401 is disposed such that the flange portion thereof extends horizontally (a direction of the paper surface in the drawing) across a flow direction of the particles in the space between the sample stage 106 and the upper container 101, gas particles and neutral particles in the plasma are moved through the through holes of the flange portion, and meanwhile, charged particles in the plasma is prevented from moving downward. That is, the charged particles of the plasma reach the sample stage 106 below the confinement ring 401 or the outer peripheral side wall surface of the sample stage 106 and a surface of members forming the inner wall surface of the processing chamber 104, so that interaction with the material of the members constituting these portions and adhesion to the surface thereof can be prevented.

Further, in the present embodiment, a first vacuum gauge 402 for detecting the pressure inside the processing chamber 104 when the wafer 108 is processed is connected to the outer side wall surface of the sample stage base 107. The first vacuum gauge 402 is connected to a pipe line connected to the side wall surface around the opening outside the through hole that penetrates the ring-shaped portion of the sample stage base 107 via an on-off valve 403 which is disposed above the pipe line to open and close a gas path inside the pipe line, and is configured to be able to communicate with the inside of the processing chamber 104 via the through hole. The first vacuum gauge 402 of the present embodiment is a capacitance manometer that is not easily affected by corrosion due to a reactive gas and has a small gas species dependency.

Further, a second vacuum gauge 404 for calibration is connected and disposed below the base plate 109 of the present embodiment. The second vacuum gauge 404 is connected to a pipe line 409 connected to a bottom surface around the opening at a lower end of the through hole that penetrates the base plate 109 via the on-off valve 405 which is disposed above the pipe line 409 to open and close a gas path inside the pipe line 409. The through-hole of the base plate 109 is disposed at a position where the through hole disposed in the bottom surface of the lower container 102 farthest from the space where plasma is generated in the processing chamber 104 matches the vertical axis or at a position close to that extent, and the second vacuum gauge 404 and the space below the sample stage 106 inside the processing chamber 104 communicate with each other via one through hole that penetrates the lower container 102 and the base plate 109.

The on-off valve 405 between the second vacuum gauge and the processing chamber 104 is adjusted so that an on/off operation can be performed independently of the on-off valve 403 that opens and closes communication between the first vacuum gauge 402 and the processing chamber 104. The on-off valve 405 keeps the pipe line 409 closed when the wafer 108 is processed and prevents the second vacuum gauge 404 from being exposed to the particles of the active gas in the processing chamber 104, and radicals and by-products adhere to a diaphragm inside the second vacuum gauge 404, thereby reducing loss of accuracy in detecting the pressure.

The second vacuum gauge 404 is provided to calibrate a detection value of the pressure inside the processing chamber 104 of the first vacuum gauge 402, and based on this, it is preferable to use a vacuum gauge that can be regarded as having a type and a kind the same as the first vacuum gauge 402 and having the same operation and accuracy.

In the present embodiment, a penning vacuum gauge 408 provided as another vacuum gauge that accurately detects the pressure inside the processing chamber 104 that is depressurized to a high vacuum degree is connected to the pipe line 409 via an on-off valve 410 that opens and closes the communication in the path between the pipe line 409 and the penning vacuum gauge 408. The penning vacuum gauge 408, which is an ionization vacuum gauge, is capable of detecting a high vacuum degree pressure value with accuracy higher than that of the first vacuum gauge 402 and the second vacuum gauge 404, and on the other hand, in a range of a pressure of the processing chamber 104 when the wafer 108 is processed, in which the first vacuum gauge 402 whose type and kind the same as the second vacuum gauge 404 is used, accuracy of the penning vacuum gauge is significantly lower than these pressure gauges, and alternatively, the penning vacuum gauge has a characteristic that cannot be used.

Further, on the outer side wall of the lower container 102 of the present embodiment, a lower heater 406 that is supplied with electric power and generates heat is wound and disposed on the side wall surface, and the inner wall surface of the lower container 102 is heated by heat generation, so that adhesion and deposition of the product on the inner wall surface is prevented. An opening at the upper end of the through hole communicating with the second vacuum gauge 404 is located below the lower heater 406.

As shown in the drawing, the first vacuum gauge 402, the second vacuum gauge 404, the on-off valves 403, 405, 410 are connected with a control unit 407, so that electrical signals including an output of a detected result and a signal for commanding an operation can be transmitted and received in a wired or wireless way. Further, the control unit 407 shown in the drawing is also connected to the exhaust gas adjuster 111, the lower heater 406, and the vacuum pump 103, so that the electric signals can be transmitted and received.

The control unit 407 includes a circuit including at least one element. The control unit 407 includes a receiving unit having an interface for receiving outputs from the first vacuum gauge 402 and the second pressure gauge 404 and transmitting a signal for adjusting operations of the exhaust gas adjuster 111, the on-off valves 403, 405, 410, the lower heater 406, and the exhaust pump 103, a calculation unit, such as a semiconductor microprocessor which calculates value data indicating the pressure based on the signal received by the receiving unit and calculates an appropriate pressure correction value by using data of the pressure value, and a storage unit that includes a memory such as a RAM or a ROM that stores a signal indicating the calculated pressure value as data, or a storage device such as a hard disk or a DVDROM.

As will be described later, in the maintenance operation of the plasma processing apparatus 100, the control unit 407 of the present embodiment transmits a signal for adjusting operations of the on-off valves 403, 405, 410, and meanwhile, calibrates the pressure detection value based on the first vacuum gauge 402 and the signal from the first vacuum gauge 402 by using the pressure values obtained from the signals from the second vacuum gauge 404 and the penning vacuum gauge 408. Further, regardless of whether the wafer 108 is being processed or not processed, in order to set the pressure in the processing chamber 104 to a value within a preferable range, a command signal for adjusting the operation of the exhaust gas adjuster 111 is transmitted by using the pressure value detected from the signal from the first vacuum gauge 402 or the second vacuum gauge 404. Further, by receiving a signal output from a temperature sensor (not shown) and adjusting magnitude of power output from the power supply electrically connected to the lower heater 406, a command signal for adjusting a temperature of the inner surface of the lower container 102 to a value within a desired range is transmitted.

Figure 5:
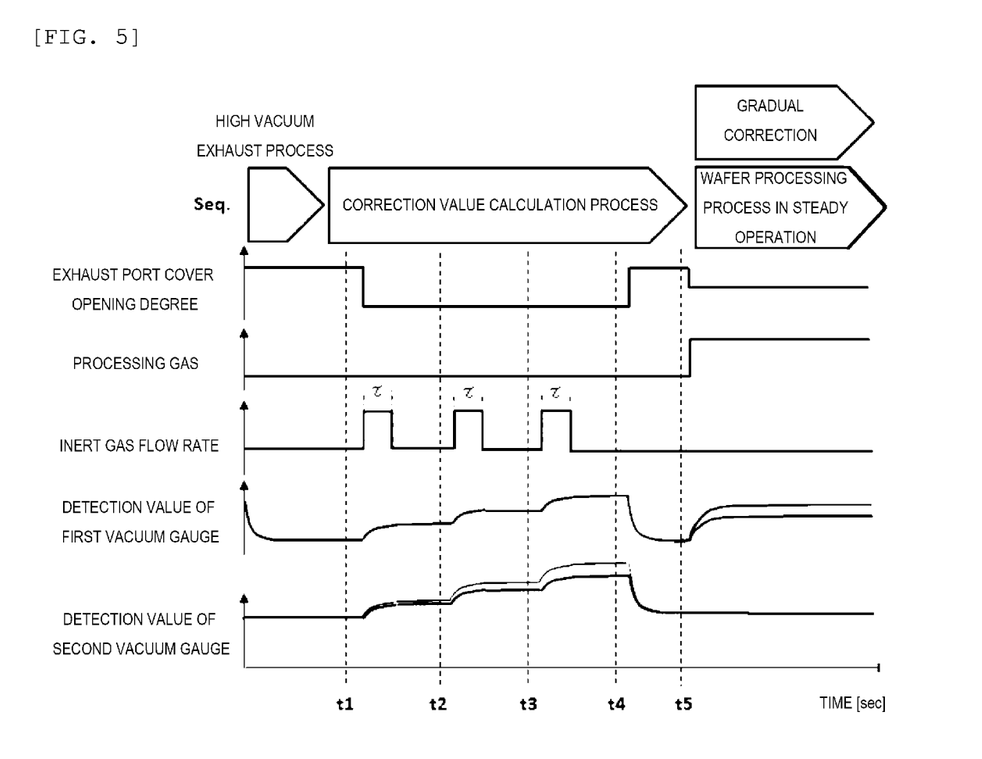
FIG. 5 is a time chart showing a flow of operations when a first vacuum gauge is calibrated during a maintenance operation of the plasma processing apparatus according to the embodiment shown in FIG. 1.

Next, a procedure for correcting the pressure value inside the processing chamber 104 detected by using the first vacuum gauge 402, which is performed in the maintenance operation of the plasma processing apparatus 100, will be described with reference to FIG. 5. FIG. 5 is a time chart showing a flow of operations when the first vacuum gauge is calibrated during a maintenance operation of the plasma processing apparatus according to the embodiment shown in FIG. 1.

The calibration of the first vacuum gauge 402 of the present embodiment is performed by using the value obtained from each output of the first vacuum gauge 402 as a calibration target and the second vacuum gauge 404 as a calibration reference instrument when the pressure inside the processing chamber 104 is changed to different values between a (high vacuum exhaust) process of evacuating the processing chamber 104 to a high vacuum degree to reduce the pressure when the operation of the plasma processing apparatus 100 is switched from the steady operation of processing the wafer 108, which is a process of manufacturing the semiconductor device to the maintenance operation after the wafer 108 is processed at the end of the steady operation, and a high vacuum exhaust process that is performed before the maintenance operation is ended and being switched to the normal operation. Especially between the high vacuum exhaust processes, a correction value calculation process for calculating an amount for correcting the value detected from the output of the first vacuum gauge 402 by using a result obtained by comparing pressure values inside the processing chamber 104 using the first vacuum gauge 402 and the second vacuum gauge 404 under the pressure conditions inside the plurality of processing chambers 104 is provided.

In the steady operation of the plasma processing apparatus 100 after the pressure detection result is calibrated by using the first vacuum gauge 402, even when the pressure conditions in the processing of the plurality of processes of the wafer 108 in the processing chamber 104 are different, the pressure value of the inside of processing chamber 104 by the first vacuum gauge 402 is sequentially corrected by using a correction value (correction parameter value) calculated by calibration. As a result, the processing conditions in the processing chamber 104 are implemented with high accuracy, and a processing yield of the wafer 108 is improved.

First, based on the command signal from the control unit 407, the gate valve 129 is hermetically closed after the last wafer 108 in the steady operation is carried out of the processing chamber 104, and the inside of the processing chamber 104 is sealed with respect to the inside of the valve box 127 or the vacuum transfer chamber. In this state, after the controller 407 detects that the operation mode of the plasma processing apparatus 100 is switched from the steady operation to the maintenance operation, based on the command signal from the control unit 407, as the high vacuum exhaust process in an initial stage of calibration, in a state in which the wafer 108 is not mounted on the sample stage 106 and a gas is not supplied to the processing chamber 104, the exhaust gas adjuster 111 maintains the exhaust port cover 110 at a highest position and the exhaust port 124 open, and by operating the vacuum pump 103, particles inside the processing chamber 104 are exhausted to the outside of the processing chamber 104, and the inside of the processing chamber 104 is depressurized.

After the high vacuum exhaust process is continued for a predetermined period, the control unit 407 that receives the output signal from the penning vacuum gauge 408 uses the signal to determine whether the pressure inside the processing chamber 104 reaches a pressure of a predetermined vacuum degree determined in advance. When it is determined that the pressure inside the processing chamber reaches the predetermined vacuum degree, for example, at time t1 when the exhaust is continued for a predetermined time (1 second in this example), based on the signal from the control unit 407, the on-off valve 403 of the first vacuum gauge 402 and the on-off valve 405 of the second pressure gauge 404 are driven to open the pipe line, so that the results detected by the first vacuum gauge 402 and the second vacuum gauge 404 are output from these and transmitted to the control unit 407. The control unit 407 stores data indicating the respective pressure values detected from the received outputs from the first vacuum gauge 402 and the second vacuum gauge 404 and values of differences thereof in a memory in the storage unit or a storage device.

The difference between the pressure values detected from the outputs of the first vacuum gauge 402 and the second vacuum gauge 404 at a stored time t1 and the respective pressure values can be used to detect whether the operation of the first vacuum gauge 402 or the second vacuum gauge 404 is abnormal. When the control unit 407 detects that the value detected from the output from at least one of the first vacuum gauge 402 and the second pressure gauge 404, or the value of the difference between these values is outside the predetermined allowable range, the control unit 407 can give a warning of occurrence of an abnormality on an alarm provided for implementation or an electrically connected display.

Next, with the on-off valve 403 and the on-off valve 405 remaining open, the exhaust gas adjuster 111 is driven to move the exhaust port cover 110 downward, and the exhaust port 124 is hermetically closed to prevent the particles inside the processing chamber 104 from flowing out. In this state, an inert gas is supplied into the processing chamber 104 through the gas flow path 115' of the gas ring 115 and the through hole of the shower plate 113 only for a predetermined period τ and stopped. Further, at a time t2 after this state is maintained for a predetermined time, outputs of the first vacuum gauge 402 and the second vacuum gauge 404 are transmitted to the control unit 407, based on the respective output signals received in the control unit 407, the pressure value and the value of the difference therebetween are calculated, and those data are stored in the storage unit as at the time t1. The pressure being detected from the output of the vacuum gauge after a predetermined time is passed after the period τ is for setting the pressure in the processing chamber 104 after the inert gas is supplied and waiting for detection until the pressure reaches a steady state.

Further, as in the case of the time t1 to t2, the control unit 407 keeps the exhaust port cover 110 closed, the supply is stopped after the inert gas is introduced into the processing chamber 104 for the period τ, at a time t3 or t4 after a predetermined time is elapsed, the pressure values indicated by each from the output of the first vacuum gauge 402 and the second vacuum gauge 404 and the value of the difference therebetween is detected and is stored in the storage unit. Within a pressure range of the processing chamber 104 detected by these vacuum gauges, the pressure value and the difference value indicated by the vacuum gauges may be detected and the data indicating these values may be stored at two or more different times including the high vacuum exhaust process.

In the present embodiment, by using the pressure value and the difference value detected from the outputs of the first vacuum gauge 402 and the second vacuum gauge 404 at such a plurality of time points (4 points from the time t1 to t4 in this example), a correlation relationship between the output value of the first vacuum gauge 402 or the value of the pressure indicated by the output and the output value or the pressure value of the second vacuum gauge 404 that serves as a reference is approximated as a polynomial using parameters calculated by the calculation unit according to a software algorithm stored in the storage unit in the control unit 407. By using the polynomial related to the parameter stored in the storage unit, the control unit 407 calculates an amount of correction for the data of the pressure value of the processing chamber 104 detected from the output of the first vacuum gauge 402 in the processing performed in the processing chamber 104.

For example, a value of a slope is calculated as a ratio of the difference between the pressure values at the times t1 and t2 stored in the storage unit of the control unit 407 and a value of (pressure value at the time t2)−(pressure value at the time t1), that is, a parameter of a linear equation, and a difference between the pressure values obtained from the outputs of the first vacuum gauge 402 and the second vacuum gauge 404 at any pressure value is calculated by using the linear expression using the value of this slope as the parameter. Data correlated with any pressure value calculated in the calculation unit by the above approximate polynomial and a correction value of the value obtained from the output of the first vacuum gauge corresponding to the pressure value or the corrected pressure value is stored in the storage unit of the control unit 407, and the correction value calculation process is ended.

When the correction value calculation process is ended, the control unit 407 drives the exhaust gas adjuster 111 to move the exhaust port cover 110 to the highest position to fully open the exhaust port 124, and similar to the first high vacuum exhaust process before the correction value calculation process, a second high vacuum exhaust process is performed to exhaust the inside of the processing chamber 104 again to reduce the pressure to the predetermined vacuum degree. Until it is detected, by using the penning vacuum gauge 408, that the pressure inside the processing chamber 104 in the control unit 407 is reached a value of the predetermined vacuum degree, after the second high vacuum exhaust process is performed for the predetermined period, at a time t5 when the high vacuum exhaust is continued for another 1 second, the control unit 407 drives the on-off valve 405 of the second vacuum gauge 404 to hermetically close the pipe line.

Further, the control unit 407 reads a correction value corresponding to the pressure of the vacuum degree calculated based on the polynomial in the correction value calculation process from the storage unit, and the pressure value detected from the signal output from the first vacuum gauge 402 at the time t5 is corrected by using the correction value. That is, the first vacuum gauge 402 is corrected. When the value of the pressure reached in the second high vacuum exhaust process is sufficiently smaller than the pressure of the processing chamber 104 at time t2 to t4, this correction is an offset of the pressure value obtained from the output of the first vacuum gauge 402. It is preferable that the pressures of the vacuum degrees reached in the first and second high vacuum exhaust processes have the same value.

After the second high vacuum exhaust process, the control unit 407 switches the operation of the plasma processing apparatus 100 to the steady operation mode. In the steady operation, an offset value is detected by the control unit 407 as the pressure value of the processing chamber 104, the processing condition is adjusted, and the wafer 108 is processed. In this way, after the correction of the first vacuum gauge 402 in the maintenance operation is performed, the steady operation of the plasma processing apparatus 100 is restarted, and the wafer 108 is carried into the processing chamber 104 and processed. Further, the operation of the exhaust gas adjuster 111 is adjusted based on the detection value from the output of the first vacuum gauge 402 that is accurately corrected for any pressure value, and the opening of the exhaust port cover 110 or the pressure inside the processing chamber 104 due to increase/decrease in height from an inlet of the exhaust port 124 is adjusted.

The difference in the pressure value obtained from the output of the first vacuum gauge 402 with respect to the pressure value obtained from the output of the second vacuum gauge 404 serving as a reference at any pressure point calculated in the correction value calculation process in the control unit 407 is corrected to detect the pressure in the processing chamber 104, so that even when the pressure condition during processing is changed to a different value depending on the processed process, the pressure is realized with high accuracy by performing accurate corrections one after another, and a processing yield can be improved.

In the above embodiment, after a cumulative number of processed wafers 108 or the time reaches a predetermined value, the first vacuum gauge 402 is calibrated during the maintenance operation, but the correction value calculation process may be performed for each processing of each wafer 108. In this case, after the processing of any one wafer 108 is completed and the processed wafer 108 is carried out of the processing chamber 104, and after performing the first high vacuum exhaust process, the correction value calculation process and the second high vacuum exhaust process to calibrate the first vacuum gauge 402, the next wafer 108 is processed. A frequency of calibration including such the correction value calculation process can be freely set by a user using the control unit 407, such as for each lot, in consideration of magnitude of changes in the pressure value in the processing chamber 104 that are detected by the user in terms of throughput improvement.

Further, in the above embodiment, the pressure inside the processing chamber 104 is detected at four points from time t1 to t4, or at five points when the offset t5 in the second high vacuum exhaust process is included, and the first vacuum gauge 402 is calibrated, but an appropriate time point is selected according to an order of the approximation polynomial used in the correction value calculation process and the statistics or mathematical method to be approximated.

Further, in the above embodiment, by using the approximate polynomial relating to the parameter calculated in the correction value calculation process, the correction amount of the pressure value detected from the output of the first vacuum gauge 402 for any pressure value is calculated, the corrected value (corrected value) may be stored in the storage unit of the control unit 407 as a data table in association with the pressure value detected from the output of the first vacuum gauge 402. In this case, since a value to be corrected for the pressure value in the second high vacuum exhaust process, that is, the amount of offset, is also corrected in advance and calculated in the calculation process, a process of offsetting the detection value from the output of the first vacuum gauge 402 at time t5 is unnecessary.

In the above embodiment, the pressure inside the processing chamber is measured by using the first vacuum gauge and the second vacuum gauge at a plurality of different pressure values that are gradually increased in the order of t1 to t4, and by using the pressure difference value obtained from these outputs, a coefficient of an equation having the predetermined pressure value as the parameter is calculated. The correction device 407 uses the equation obtained in this way to transmit a value obtained by correcting the output value of the pressure detected by the first vacuum gauge 402 to the pressure control device 111, so that the pressure in the processing chamber is high-accurately adjusted.

According to such a configuration, the amount of pressure difference during processing performed in the processing chamber from the desired pressure is reduced, and the processing yield can be improved.

REFERENCE SIGN LIST

100: plasma processing apparatus
101: upper container
102: lower container
103: vacuum pump
104: processing chamber
105: solenoid coil
106: sample stage
107: sample stage base
108: wafer
109: base plate
110: exhaust port cover
111: exhaust gas adjuster
112: window member
113: shower plate
114: inner cylinder
115: gas ring
115': gas flow path
116: grounding ring
117: discharge portion container
118: heater
119: discharge block base
120: sample stage bottom cover
121: cavity portion
122: waveguide
123: magnetron
124: exhaust port
125: column
126: vacuum transfer container
127: valve box
128, 129: gate valve
130: driving machine
201: lifter
202: discharge portion container unit
203: movable shaft
204: connection arm
301: sample stage unit
302: movable shaft
303: connection arm
401: confinement ring
402: first vacuum gauge
403: on-off valve
404: second vacuum gauge
405: on-off valve
406: lower heater
407: control unit
408: penning vacuum gauge
409: pipe line
410: on-off valve

The invention claimed is:
1. A plasma processing apparatus comprising:
a sample stage that is disposed in a processing chamber inside a vacuum container and on which a wafer to be processed is placed;

a plasma forming space that is a space above the sample stage of the processing chamber and in which plasma for processing the wafer is formed by using a supplied processing gas;

a lower space that is a space of a lower portion of the processing chamber below the sample stage, and is in communication with the plasma forming space via a space in the processing chamber on an outer periphery of the sample stage;

an exhaust port that is disposed at a bottom portion of the lower space and is in communication with an exhaust device that exhausts and decompresses an inside of the processing chamber;

a heater that is configured to heat a lower portion of the vacuum container surrounding the lower space;

a first vacuum gauge that is configured to detect a pressure in the processing chamber during the processing of the wafer;

a second vacuum gauge for calibration that is below the first vacuum gauge and in communication with an opening that disposed on an inner wall of the processing chamber that surrounds an outer periphery of the lower space; and a correction unit that is configured to correct an output of the first vacuum gauge by using outputs of the first and second vacuum gauges when a pressure in the processing chamber is at a pressure value selected as zero and at a plurality of pressure values higher than the pressure value selected as zero.

2. The plasma processing apparatus according to claim 1, further comprising:

a ring-shaped plate member that surrounds an outer periphery of a side wall of the sample stage and includes a plurality of through holes that are disposed below the upper surface and through which the processing gas or a plasma particle passes, wherein an opening communicating with the first vacuum gauge is disposed on the inner wall of the processing chamber below the ring-shaped plate member.

3. The plasma processing apparatus according to claim 1, wherein the inner wall of the processing chamber that surrounds the lower space is heated by the heater to a temperature at which the processing gas or a plasma particle is prevented from adhesion during the processing of the wafer.

4. The plasma processing apparatus according to claim 1, wherein after the pressure in the processing chamber is reduced to a high vacuum degree that is selected as zero, and after a gas is supplied to the processing chamber for a predetermined period in a state in which the exhaust port is hermetically closed, the correction unit corrects the output of the first vacuum gauge by using a result of repeating a plurality of times detection of the pressure value using the first and second vacuum gauges in a state in which the supply is stopped and the pressure in the processing chamber rises.

5. The plasma processing apparatus according to claim 1, wherein the correction unit corrects the output of the first vacuum gauge to an approximate value by using a predetermined mathematical expression at a pressure value that is selected as zero and a plurality of pressure values higher than the pressure value selected as zero.

6. An operating method of a plasma processing apparatus which includes: a sample stage that is disposed in a processing chamber inside a vacuum container and on which a wafer to be processed is placed; a plasma forming space that is a space above the sample stage of the processing chamber and in which plasma for processing the wafer is formed by using a supplied processing gas; a lower space that is a space of a lower portion of the processing chamber below the sample stage, and is in communication with the plasma forming space via a space in the processing chamber on an outer periphery of the sample stage; an exhaust port that is disposed at a bottom portion of the lower space and is in communication with an exhaust device that exhausts and decompresses an inside of the processing chamber; a heater that is configured to heat a lower portion of the vacuum container surrounding the lower space; a first vacuum gauge that is configured to detect a pressure in the processing chamber during the processing of the wafer; and a second vacuum gauge for calibration that is below the first vacuum gauge and in communication with an opening disposed on an inner wall of the processing chamber that surrounds an outer periphery of the lower space, the operating method comprising:

after a predetermined number of wafers are processed, correcting an output of the first vacuum gauge by using outputs of the first and second vacuum gauges in a state in which a pressure in the processing chamber is selected as zero and in a state in which the pressure in the processing chamber is at a plurality of pressure values higher than the pressure selected as zero.

7. The operating method of a plasma processing apparatus according to claim 6, wherein the plasma processing apparatus further includes a ring-shaped plate member that surrounds an outer periphery of a side wall of the sample stage and includes a plurality of through holes that are disposed below the upper surface and through which a processing gas or a plasma particle passes, and an opening communicating with the first vacuum gauge is disposed on the inner wall of the processing chamber below the ring-shaped plate member.

8. The operating method of a plasma processing apparatus according to claim 6, wherein the inner wall of the processing chamber that surrounds the lower space is heated by the heater to a temperature at which the processing gas or a plasma particle is prevented from adhesion during the processing of the wafer.

9. The operating method of a plasma processing apparatus according to claim 6, wherein after the pressure in the processing chamber is reduced to a degree that is selected as zero, and after a gas is supplied to the processing chamber for a predetermined period in a state in which the exhaust port is hermetically closed, correcting the output of the first vacuum gauge by using a result of repeating a plurality of times of detection of the pressure value using the first and second vacuum gauges in a state in which the supply is stopped and the pressure in the processing chamber rises.

10. The operating method of a plasma processing apparatus according to claim 6, wherein correcting the output of the first vacuum gauge to an approximate value by using a predetermined mathematical expression at a pressure value that is selected as zero and a plurality of pressure values higher than the pressure value selected as zero.

* * * * *